United States Patent [19]
Akiguchi et al.

[11] Patent Number: 6,086,441
[45] Date of Patent: Jul. 11, 2000

[54] METHOD FOR CONNECTING ELECTRODES OF PLASMA DISPLAY PANEL

[75] Inventors: Takashi Akiguchi, Osaka; Kazuto Nishida, Katano, both of Japan

[73] Assignee: Matsushita Electric Industrial Co., Ltd., Osaka-Fu, Japan

[21] Appl. No.: 09/069,334

[22] Filed: Apr. 29, 1998

[30] Foreign Application Priority Data

Apr. 30, 1997 [JP] Japan .................................. 9-112377

[51] Int. Cl.⁷ ........................................................ H01J 9/24
[52] U.S. Cl. .............................................. 445/24; 349/152
[58] Field of Search .................................. 445/24; 349/88, 349/149, 152

[56] References Cited

U.S. PATENT DOCUMENTS

| | | | |
|---|---|---|---|
| 4,964,700 | 10/1990 | Takabayashi | 349/200 |
| 4,985,663 | 1/1991 | Nakatani | 315/169.3 |
| 5,317,438 | 5/1994 | Suzuki et al. | 349/192 |

*Primary Examiner*—Kenneth J. Ramsey
*Attorney, Agent, or Firm*—Wenderoth, Lind & Ponack, L.L.P.

[57] ABSTRACT

A method is disclosed for connecting electrodes of a plasma display panel. The method includes overlapping a thick film electrode formed on a glass substrate with an electrode of a flexible substrate via an adhesive sheet having conductive particles dispersed therein, then, heating and pressuring from above the flexible substrate with a pressuring tool, to thereby set the adhesive sheet, and finally electrically connecting the electrode of the glass substrate and the electrode of the flexible substrate with each other.

17 Claims, 12 Drawing Sheets

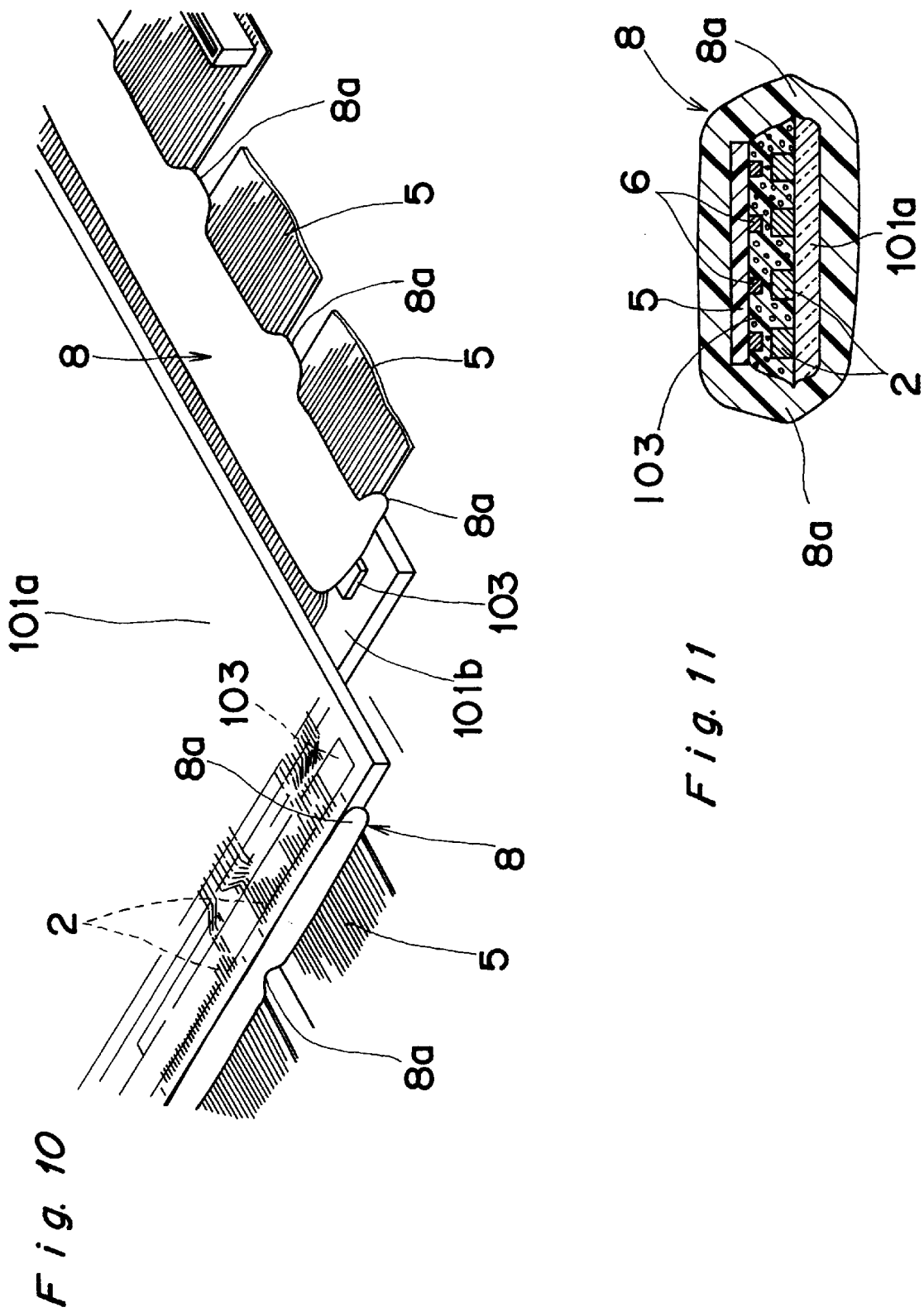

METHOD FOR CONNECTING ELECTRODES OF PLASMA DISPLAY PANEL

BACKGROUND OF THE INVENTION

The present invention relates to a method for connecting electrodes of a plasma display panel and more particularly, to a method for connecting electrodes of a plasma display panel by connecting an electrode of a flexible substrate with a thick film electrode on a glass substrate of the plasma display panel.

In the conventional technique related to mounting a flexible substrate to a thick film electrode on a glass substrate, it is known as a way of the mounting to a plasma display panel that before soldering, an electrode of the flexible substrate is pressed by a heating pressuring tool to a thick film electrode on the glass substrate. Referring to FIG. 8, an electrode 6 of a solder-plated flexible substrate 5 is registered beforehand to an electrode 2 of a glass substrate 1 of a plasma display panel. When the flexible substrate 5 is pressed from above by a heating pressuring tool 7 (with reference to FIG. 1), solder 10 of the flexible substrate 5 is melted thereby to solder the flexible substrate to the glass substrate 1.

In order to mount the flexible substrate to the plasma display panel in the above manner, not is only reliability against a high current of, for example, about 250V between terminals of the panel is needed, but a narrow electrode pitch is required to achieve a high definition panel. However, if the conventional soldering method is applied to electrodes of a narrow pitch, such difficulties as deterioration in wettability of the solder, solder bridges, etc. are brought about, thereby degrading the quality of the mounting operation, in other words, connecting operation. Using the conventional soldering method it is hard to cope with a narrow pitch of electrodes for a high definition panel.

SUMMARY OF THE INVENTION

An object of the present invention is to provide a method for connecting electrodes of a plasma display panel which eliminates instability in the quality the connecting operation and suits with a high current and a narrow pitch of electrodes, thereby to realizing highly reliable connecting quality.

In accomplishing these and other aspects, according to a first aspect of the present invention, there is provided a method for connecting electrodes of a plasma display panel, which comprises:

overlapping a thick film electrode formed on a glass substrate with an electrode of a flexible substrate via an adhesive sheet having conductive particles dispersed therein;

heating and pressuring from above the flexible substrate by a pressuring tool, thereby setting the adhesive sheet; and electrically connecting the electrode of the glass substrate and the electrode of the flexible substrate with each other.

In the configuration as above, the electrode on the glass substrate and the electrode of the flexible substrate are electrically connected without soldering, and therefore a good connection is secured between the electrodes. Difficulties inherent in the use of the solder, that is, improper electric connection due to the oxidation or corrosion of the solder, poor wettability of the solder at the time of soldering, solder bridges, etc. are prevented, so that the degradation in connecting quality is avoided. The electrodes can be connected to each other with high reliability to meet the narrow pitch of the electrodes.

According to a second aspect of the present invention, there is provided a method for connecting electrodes of a plasma display panel according to the first aspect, wherein the electrode of the glass substrate is a silver electrode and the conductive particles in the adhesive sheet are nickel particles.

According to a third aspect of the present invention, there is provided a method for connecting electrodes of a plasma display panel according to the second aspect, wherein the conductive particles in the adhesive sheet are gold-plated nickel particles.

Owing to the above second and third aspects of the present invention, the conductive particles are prevented from being oxidized even if the plasma display panel is exposed to high temperatures. Barriers to the electric connection can thus be prevented.

According to a fourth aspect of the present invention, there is provided a method for connecting electrodes of a plasma display panel, which comprises:

overlapping a thick film electrode formed on a glass substrate with an electrode of a flexible substrate via a temporary fixing adhesive sheet;

heating and pressuring from above the flexible substrate with a pressuring tool, thereby setting the adhesive sheet while letting pits and projections generated on a surface of the electrode of the glass substrate bite into the electrode of the flexible substrate; and electrically connecting the electrodes with each other.

In the arrangement according to the fourth aspect, the pits and projections formed at the surface of the thick film electrode are utilized. The pits and projections are adapted to bite into the surface of the confronting electrode, thereby electrically connecting both electrodes. Conductive particles are accordingly eliminated, in other words, the need, for uniformly arranging the conductive particles in the adhesive sheet is eliminated. Further, since the electrode on the glass substrate and the electrode of the flexible substrate are connected without using solder, a good connection is ensured between the electrodes, which is not accompanied by such difficulties as the oxidation or corrosion of the solder, failure in electric connection, poor wettability of the solder on the occasion of soldering, solder bridges and the like. The electrodes can be connected to each other with high reliability to fit the reduced pitch of the electrodes.

According to fifth to eighth aspects of the present invention, there is provided a method for connecting electrodes of a plasma display panel according to the first to fourth aspects, which further includes:

covering, with a silicone resin, a part where the electrode of the flexible substrate and the electrode of the glass substrate are connected; and setting the covered silicone resin.

According to a ninth aspect of the present invention, there is provided a method for connecting electrodes of a plasma display panel according to the fifth aspect, wherein the silicone resin is 0.3 µm to 2 mm thick.

According to 10th to 14th aspects of the present invention, there is provided a method for connecting electrodes of a plasma display panel according to the fifth to ninth aspects, wherein front and rear surfaces of the part are covered with the silicone resin, and the silicone resin on the rear surface side of the part is integrally mixed with the silicone resin on the front surface side of the part.

In the fifth to 14th aspects of the present invention, the invasion of moisture or corrosive gas to the connected part of the electrodes resulting in the oxidation of the electrodes or conductive particles is prevented, thus protecting the electric connection from barriers.

According to 15–18th aspects of the present invention, there is provided a method for connecting electrodes of a plasma display panel according to the first to fourth aspects, which further includes:

covering, with a resin of a type which can be set by ultraviolet rays, a part where the electrode of the flexible substrate and the electrode of the glass substrate are connected; and projecting ultraviolet rays to the covered resin, thereby setting the resin.

In the method of the 15–18th aspects, the invasion of moisture or corrosive gas to the connected part of the electrodes is prevented in a short time. At the same time, the coating obtained can guard the electrodes or conductive particles against the oxidation and barriers to the electric connection, thereby realizing highly reliable connecting quality.

BRIEF DESCRIPTION OF THE DRAWINGS

These and other objects and features of the present invention will become clear from the following description taken in conjunction with the preferred embodiments thereof with reference to the accompanying drawings, in which:

FIG. 10 is a partially perspective view showing a state where the electrodes of the flexible substrate are connected to the electrodes of the glass substrate and then silicon resin is applied to the connecting parts, according to the method of connecting electrodes of the plasma display panel in the third embodiment of the present invention;

FIG. 11 is an enlarged partially perspective view showing a state where the silicone resin applied on a front surface of the connected parts where the electrodes of the flexible substrate are connected to the electrodes of the glass substrate is continuously and integrally connected to the silicone resin applied on a rear surface of the connected parts without forming boundary at ends of the connected parts, in FIG. 10;

DETAILED DESCRIPTION OF THE PREFERRED EMBODIMENTS

Figure 1:
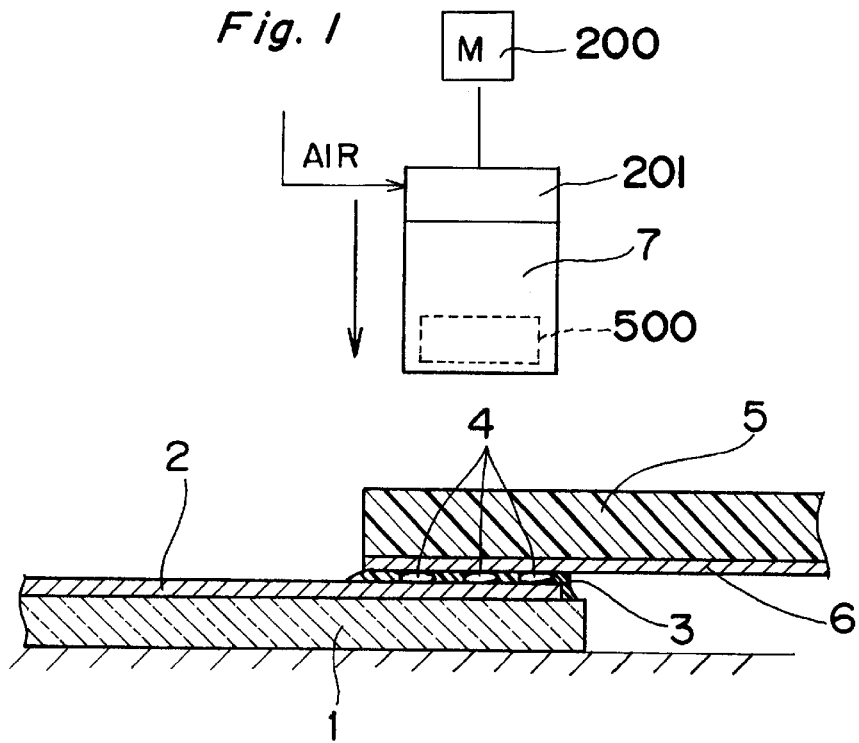
FIG. 1 is a sectional view showing a connect state in a connecting process of a flexible substrate to a glass substrate according to a method of connecting electrodes of a plasma display panel in a first embodiment of the present invention.

Before the description of the present invention proceeds, it is to be noted that like parts are designated by like reference numerals throughout the accompanying drawings.

Preferred embodiments of the present invention will be detailed with reference to the drawings.

<First Embodiment>

Figure 7:
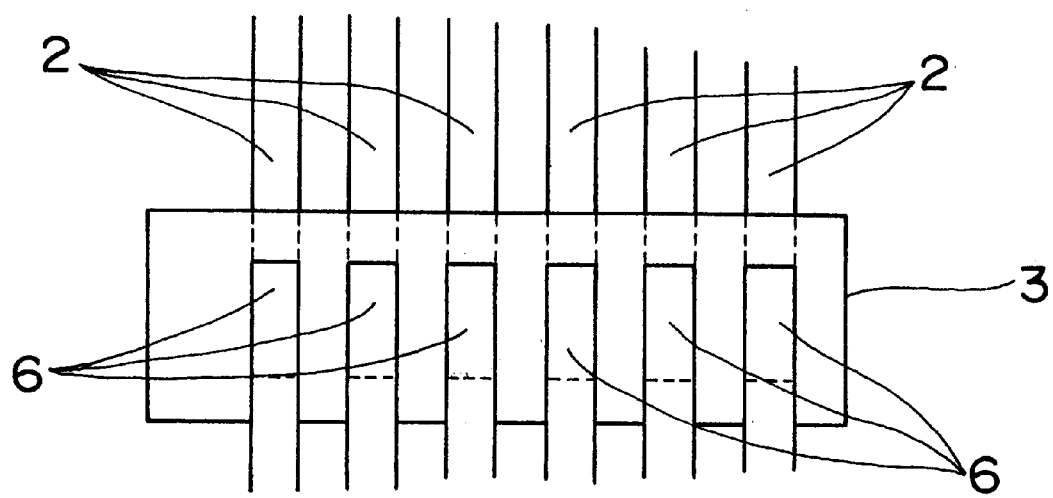
FIG. 7 is a plan view of the connect state.
Figure 8:
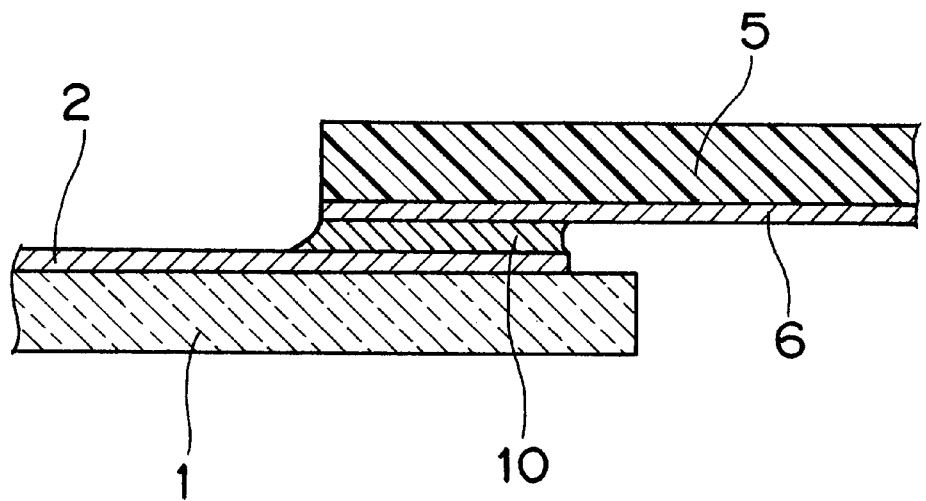
FIG. 8 is a sectional view of a connect state in a connecting process according to a conventional method for mounting a flexible substrate to a glass substrate.
Figure 13:
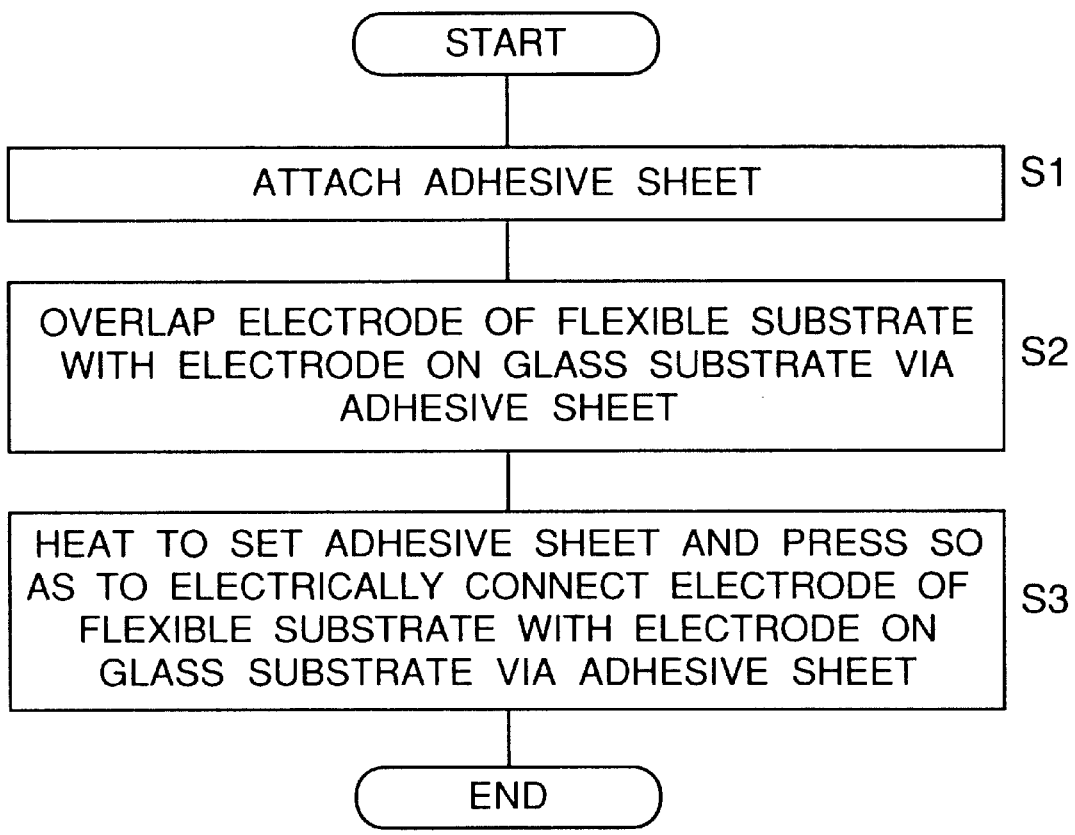
FIG. 13 is a flowchart of connecting the flexible substrate with the glass substrate by using the method of connecting electrodes of the plasma display panel in the first embodiment of the present invention.

FIG. 1 shows a method for connecting electrodes of a plasma display panel according to a first embodiment of the present invention, more specifically, a sectional view after of electrodes 2 on a glass substrate 1 of a plasma display panel and electrodes 6 of a flexible substrate 5 are connected to each other. FIG. 7 is a plan view of a state of the electrodes 2 and 6 after being connected with each other. FIG. 13 is a flowchart of connecting the electrodes of the flexible substrate with the electrodes on the glass substrate by using the method of connecting the electrodes of the plasma display panel in the first embodiment of the present invention. Referring to FIG. 1, the method comprises processes of: attaching an adhesive sheet 3 having nickel particles 4, as an example of conductive particles dispersed therein, to the thick film silver electrodes 2, of each 5 μm to 15 m thickness, as an example of thick film electrodes, formed on the glass substrate 1 (step S1 in FIG. 13); overlapping the electrodes 6 of the flexible substrate 5 with the electrodes 2 on the glass substrate 1 via the adhesive sheet 3 (step S2 in FIG. 13); and heating and presurring the flexible substrate 5 from above with a pressuring tool 7 (step S3 in FIG. 13), thereby setting the adhesive sheet 3 and electrically connecting the electrodes 2 on the glass substrate 1 with the electrodes 6 of the flexible substrate 5 via the conductive particles 4. The pressuring tool 7 has a heater 500 for heating the adhesive sheet 3, which is incorporated in the lower end thereof. The pressuring tool 7 also has an air cylinder (for example, "Bellofram Cylinder" manufactured by Fujikura Gomu Kougyo Kabushiki Kaisha) 201 at the upper end thereof, and the whole of the pressuring tool 7 is moved upward and downward by a motor 200. The pressuring tool 7 is moved downward by the motor 200 and comes in contact with the flexible substrate 5 on the glass plate 1 placed on a receiving base 202. Thereafter, while the adhesive sheet 3 is set by heating with the heater 500, the air cylinder 201 is driven by supplying air thereto, so that the electrodes 6 of the flexible substrate 5 are pressed against the electrodes 2 on the glass substrate 1 via the conductive particles 4 and thus, the electrodes 2 on the glass substrate 1 are electrically connected with the electrodes 6 of the flexible substrate 5 via the conductive particles 4. The above heating and pressuring devices can be used in the later-described embodiments.

A material for the adhesive sheet 3 is not specifically limited, but preferably, comprises a thermosetting resin. A shape of the adhesive sheet 3 is not specified. The adhesive sheet 3 preferably has a breadth of 1 mm or larger and a thickness of 15 $\mu$m to 60 $\mu$m. If the adhesive sheet 3 is smaller than 1 mm in breadth, the sheet cannot pass a current of 0.5 A or larger, whereby the panel cannot operate, which is unfavorable. If the adhesive sheet 3 has the thickness smaller than 15 $\mu$m, the adhesive sheet lacks the necessary adhering strength and is prone to delaminate. When the adhesive sheet 3 is 60 $\mu$m thick or thicker, the electric connection of the electrodes 2 and 6 is not obtained. Therefore, the adhesive sheet 3 is more preferably 35 $\mu$m to 40 $\mu$m thick to correspond to 5 $\mu$m to 15 $\mu$m thickness of the thick film electrode 2. Within this range of the thickness, the adhesive sheet 3 bulges out by an appropriate amount. The adhesive sheet 3 disadvantageously adheres to the pressuring tool 7 if the thickness is beyond the range. An attachment length of the adhesive sheet 3 is sufficient if larger than a breadth of the glass substrate 1 and the flexible substrate 5 connected with each other, and is not particularly regulated.

The size of the conductive particles 4 dispersed in the adhesive sheet 3 is preferably 3 $\mu$m to 15 $\mu$m. A 0.5 A or larger current is not allowed to pass and the panel cannot operate when the particle size is smaller than 3 $\mu$m. On the other hand, a shortcircuit of the electrodes can occur when the particle size exceeds 15 $\mu$m.

The adhesive sheet 3 is not restricted to being attached to the glass substrate 1, and may be attached to the flexible substrate 5. And, without attaching it to the glass substrate 1 or the flexible substrate 5, the adhesive sheet 3 may be so arranged as to be positioned at a predetermined position when the substrates 1 and 5 are overlapped.

Materials for the glass substrate 1 and flexible substrate 5 are not to particularly limited. The thick film silver electrode 2 is formed by screen printing or photography and baked. The material of each of the electrodes 2 is not specifically restricted. Although the material of each of the electrodes 6 of the flexible substrate 5 is not specified, preferably, the electrode 6 is formed of copper which is nickel-plated and also gold-plated.

A pressuring force applied by the pressuring tool 7 is preferably approximately 20 kg/cm$^2$.

In the first embodiment described hereinabove, the electrodes 2 on the glass substrate 1 are electrically connected with the electrodes 6 of the flexible substrate 5 without using solders, so that good electric connections are ensured between the electrodes 2 and 6. Difficulties resulting from soldering, that is, barriers to the electric connection due to the oxidation or corrosion of the solder, poor wettability on the occasion of soldering, solder bridges, deterioration in connecting quality, etc., are eliminated. Moreover, the embodiment realizes highly reliable connecting quality, coping with the high current and the narrow pitch of the electrodes, e.g., 0.3 mm or smaller pitch.

<Second Embodiment>

Figure 2:
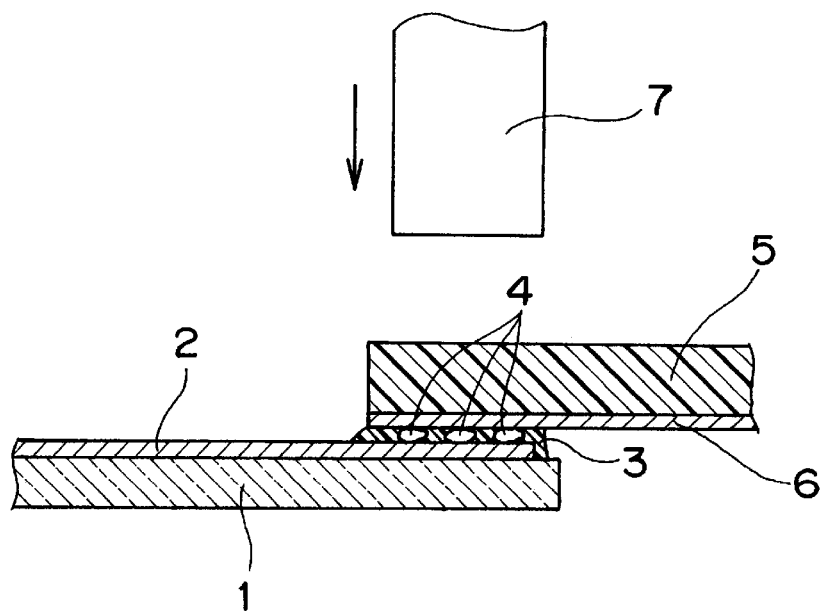
FIG. 2 is a sectional view showing a connect state in a connecting process of a flexible substrate to a glass substrate according to a method of connecting electrodes of a plasma display panel in a second embodiment of the present invention.

FIG. 2 is a sectional view of the electrodes 2 on the glass substrate 1 and the electrodes 6 of the flexible substrate 5 after being connected to each other according to a method of connecting electrodes of a plasma display panel in a second embodiment of the present invention. FIG. 7 is a plan view of the state of the connected electrodes 2 and 6. A difference from the first embodiment is that, in FIG. 2, the conductive particles 4 dispersed in the adhesive sheet 3 are obtained by gold-plating to a surface of each nickel particle of 8 $\mu$m±2 $\mu$m particle size.

A thickness of the gold coating each of the conductive particles 4 is not specifically limited. A method for plating gold is also not specified. Specifications of the material and the shape of the adhesive sheet 3, the size of each of the conductive particles 4, the materials and formation methods of the glass substrate 1, the electrodes 2 on the glass substrate 1, the flexible substrate 5 and the electrodes 6 on the flexible substrate 5 in the first embodiment apply of this embodiment.

According to the second embodiment, in addition to the operation and effect achieved in the first embodiment, the conductive particles 4 are not oxidized even if the plasma display panel is exposed to high temperatures, so that barriers in the electric connection can be prevented.

<Third Embodiment>

Figure 3:
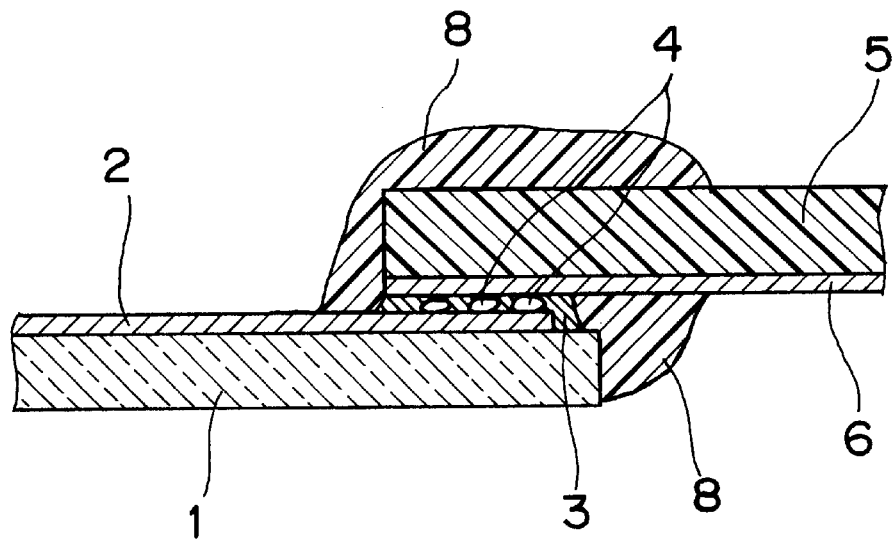
FIG. 3 is a sectional view showing a connect state in a connecting process of a flexible substrate to a glass substrate according to a method of connecting electrodes of a plasma display panel in a third embodiment of the present invention.
Figure 14:
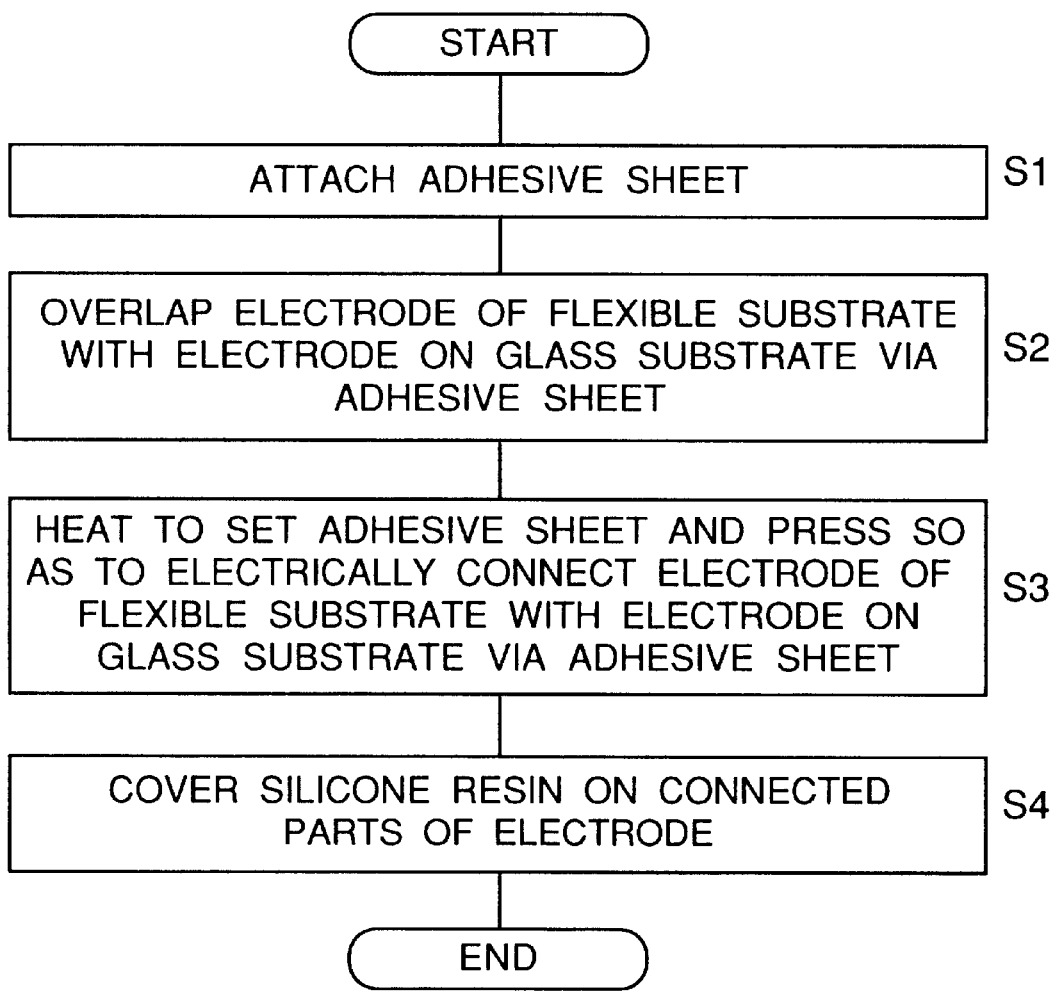
FIG. 14 is a flowchart of connecting the flexible substrate with the glass substrate by using the method of connecting electrodes of the plasma display panel in the third embodiment of the present invention.

FIG. 3 is a sectional view of the electrodes 2 on the glass substrate 1 and the electrodes 6 of the flexible substrate 5 after being connected to each other according to a method of connecting electrodes of a plasma display panel in a third embodiment of the present invention. FIG. 7 is a plan view of the electrodes 2 and 6 in the state after connection. FIG. 14 is a flowchart of connecting the electrodes of the flexible substrate with the electrodes on the glass substrate by using the method of connecting electrodes of the plasma display panel in the third embodiment of the present invention. A difference of the third embodiment in FIG. 3 from the first and second embodiments is that a silicone resin 8 is applied to cover connected parts of the electrodes 2 on the glass substrate 1 and the electrodes 6 of the flexible substrate 5, for covering ends of each electrode (step S4 in FIG. 14). The reason why the silicone resin 8 is applied to the connected parts is as follows. Generally, since a high voltage of 250V is applied between terminals of the panel in the plasma display panel, if moisture and metal ions are present between the electrodes, migration might occur by combining them with the applied high voltage. When the silicone resin 8 is applied to the connected parts to cover them, the moisture can be prevented from invading between the electrodes, effectively preventing the occurrence of migration. In order to prevent the invading of the moisture, the silicone resin 8 needs a thickness of at least 0.3 $\mu$m or more. If the thickness of the silicone resin 8 is beyond 2 mm, it takes a lot of time to set the silicone resin 8, thus causing practical issues. Therefore, the thickness of the silicone resin 8 is 0.3 $\mu$m to 2 mm, or preferably 0.5 $\mu$m to 2 mm for practical use.

Figure 9:
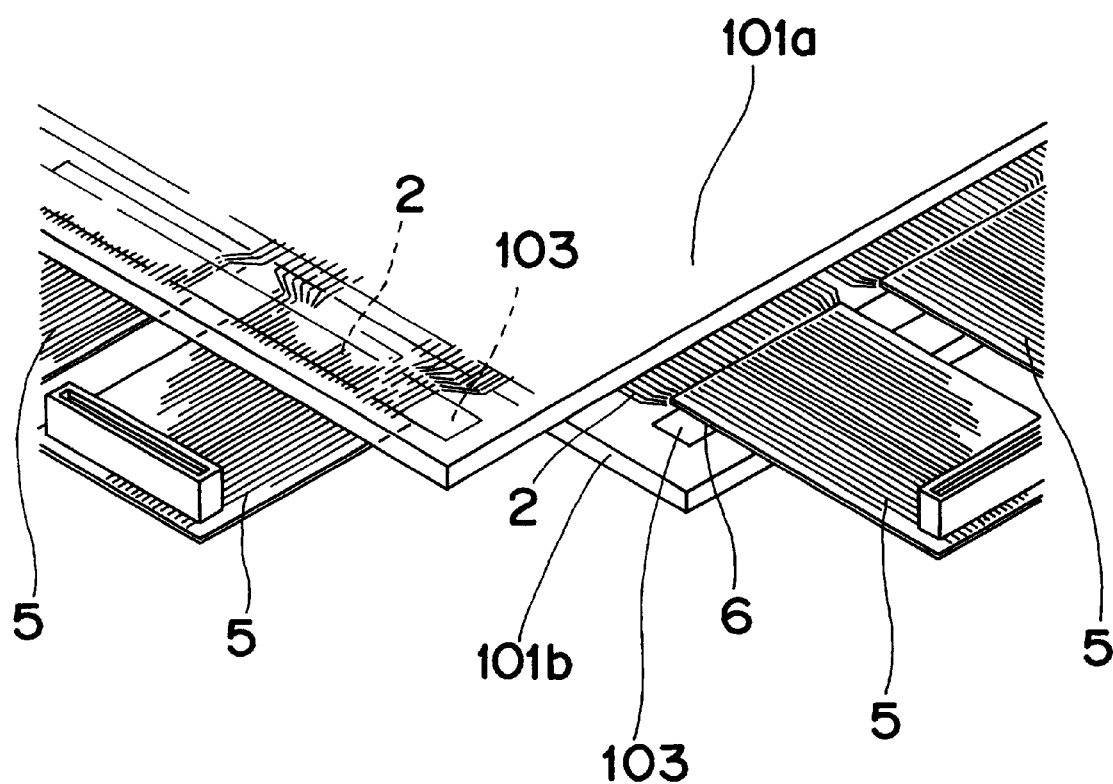
FIG. 9 is a partially perspective view showing a state connecting electrodes of the flexible substrate to electrodes of the glass substrate according to the method of connecting electrodes of the plasma display panel in the third embodiment of the present invention.

FIG. 9 is a partially perspective view showing a state of connecting electrodes of the flexible substrate to electrodes of the glass substrate according to the method of connecting electrodes of the plasma display panel in the third embodiment of the present invention. Reference numeral 101a denotes a glass plate on the front side of the panel, 101b denotes a glass plate on the rear side of the panel, and 103 denotes an ACF (anisotropic conductive film). FIG. 10 is a partially perspective view showing a state where the electrodes of the flexible substrate are connected to the electrodes of the glass substrate and then silicon resin is applied to the connecting parts, according to the method of connecting electrodes of the plasma display panel in the third embodiment of the present invention. FIG. 11 is an enlarged partially perspective view showing a state (See 8a) where the silicone resin applied on a front surface of the connected parts where the electrodes of the flexible substrate are connected to the electrodes of the glass substrate is continuously and integrally connected to the silicone resin applied on a rear surface of the connected parts without forming boundary at ends of the connected parts, in FIG. 10.

Although any kind of silicone resin can be utilized as the silicone resin 8, a silicone resin which can be set at room temperatures is preferred because the silicone resin 8 which can be set at room temperatures can be dried at room temperatures after the application. A de-alcohol or de-acetone type silicone is preferable as a material of the silicone resin 8 to avoid corrosion of the silver electrodes 2 due to moisture. The silicone resin 8 is preferably 0.3 μm to 2 mm thick, or more preferably, 0.5 μm to 2 mm thick.

Figure 15:
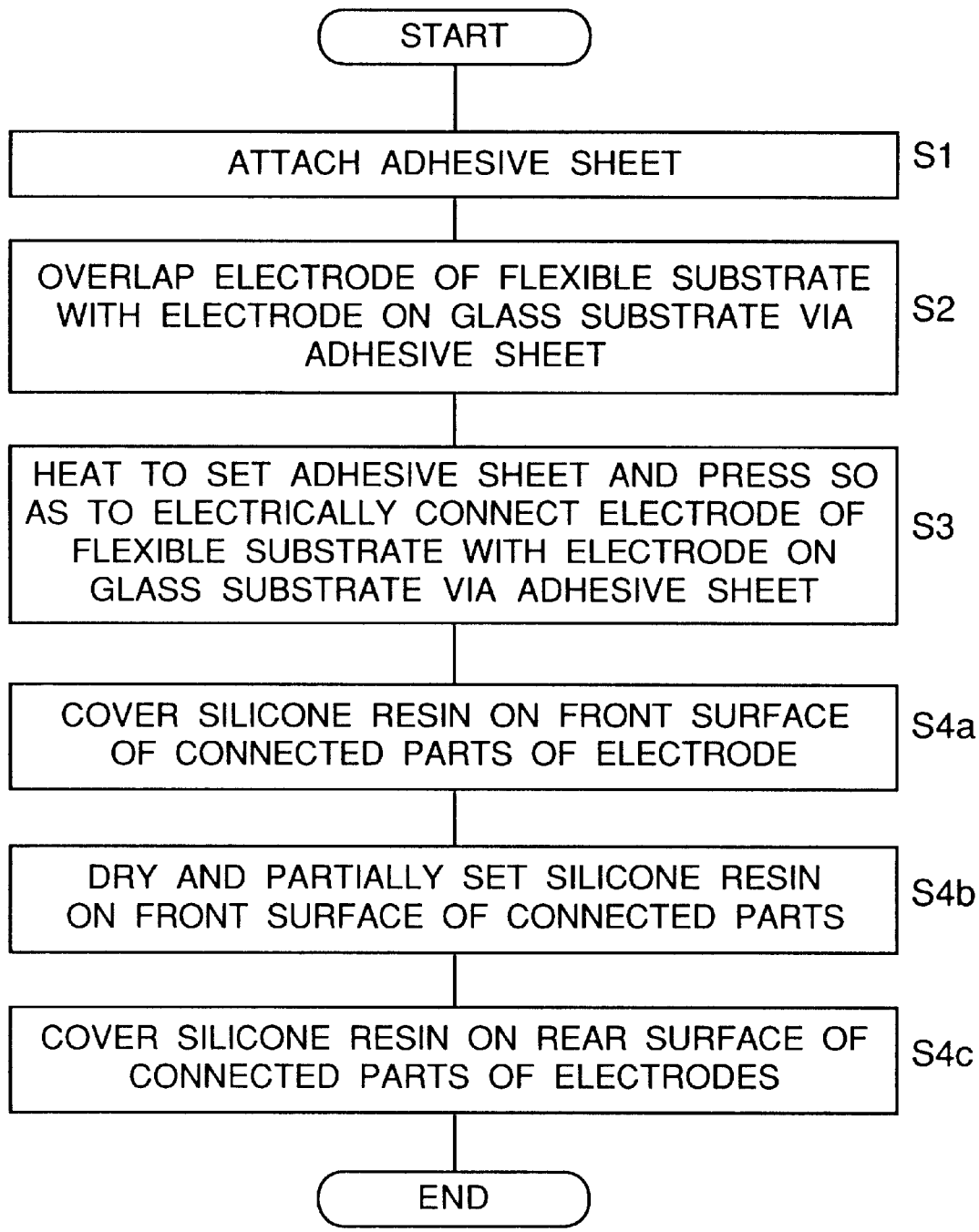
FIG. 15 is a detailed flowchart of connecting the flexible substrate with the glass substrate by using the method of connecting electrodes of the plasma display panel in the third embodiment of the present invention.

The silicone resin 8, which can be set at room temperature, is applied to the connected parts of the electrodes 2 of the glass substrate 1 and the electrodes 6 of the flexible substrate 5, such that while ends of each electrode are covered with the silicone resin 8; such an operation is performed in detail as follows. As shown in FIG. 15, using a dispenser, first, in a case of a rectangular plasma display panel, first, the silicone resin 8 capable of being set at room temperature is applied onto one of the front surface and the rear surface of the connected parts on each of four sides of the rectangularity of the plasma display panel, for example, the front surface thereof (step S4a in FIG. 15). Then, the silicone resin 8 is left at room temperature to air dry (step S4b in FIG. 15). For example, after about three to five minutes have elapsed, the applied silicone resin 8 should not drip from the front surface of the connected parts when the front surface is inverted up and down. Then, the silicone resin 8 is applied onto the other of the front surface and the rear surface of the connected parts, for example, the rear surface thereof (step S4c in FIG. 15). At this time, when the silicone resin 8 is partially set being completely set, for example, five to sixty minutes after the silicone resin application, the silicone resin 8 is applied to the other surface of the connected parts. Thus, as shown in FIG. 10, at the ends of the electrodes 5, the silicone resin 8 on the rear surface side is integrally mixed with the silicone resin 8 on the front surface side of the connected parts which contracts the rear surface side thereof, without forming any boundary between the silicone resins 8 applied to the front and rear surface sides thereof, as shown by 8a in FIGS. 10 and 11. As a result, the connected parts can be surely covered with the silicone resin 8. If any boundary is formed between the silicone resins 8 applied to the front surface side and the rear surface side of the connected parts, moisture might invade the connected parts through the boundary, which is undesirable. The conductive particles 4 dispersed in the adhesive sheet 3 are nickel particles or gold-plated nickel particles.

The same characterists as described earlier apply as to the material and the shape of the adhesive sheet 3, the size of each of conductive particles 4, the materials and formation methods of the glass substrate 1, the electrodes 2 on the glass substrate 1, the flexible substrate 5 the electrodes 6 on the flexible substrate 5.

In the third embodiment, in addition to the operation and effect asserted in the first embodiment of the present invention, the silicone resin 8 blocks the invasion of moisture or corrosive gas to the connected parts of the electrodes 2 and 6. Accordingly, the electrodes 2, and 6, and conductive particles 4 are prevented from being oxidized, whereby barriers in the electric connection are avoided.

<Fourth Embodiment>

Figure 4:
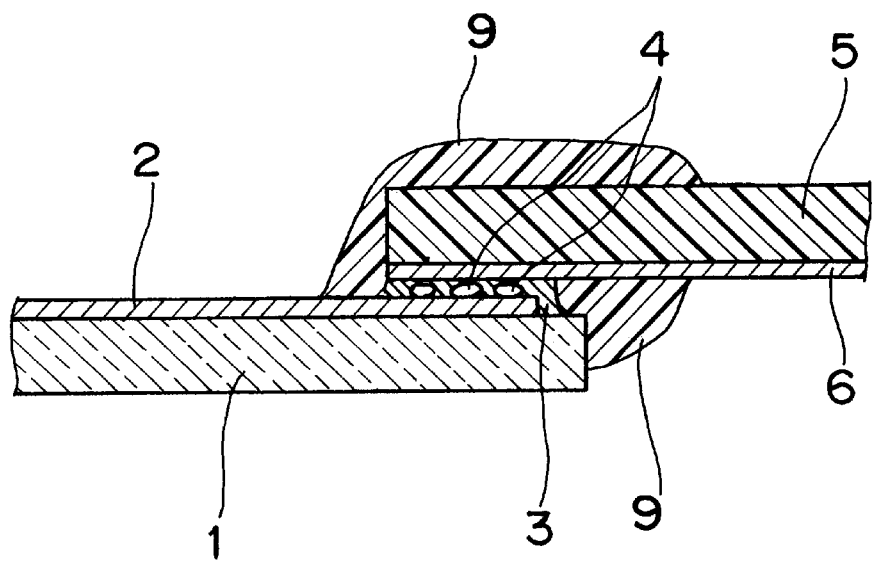
FIG. 4 is a sectional view showing a connect state in a connecting process of a flexible substrate to a glass substrate according to a method of connecting electrodes of a plasma display panel in a fourth embodiment of the present invention.
Figure 16:
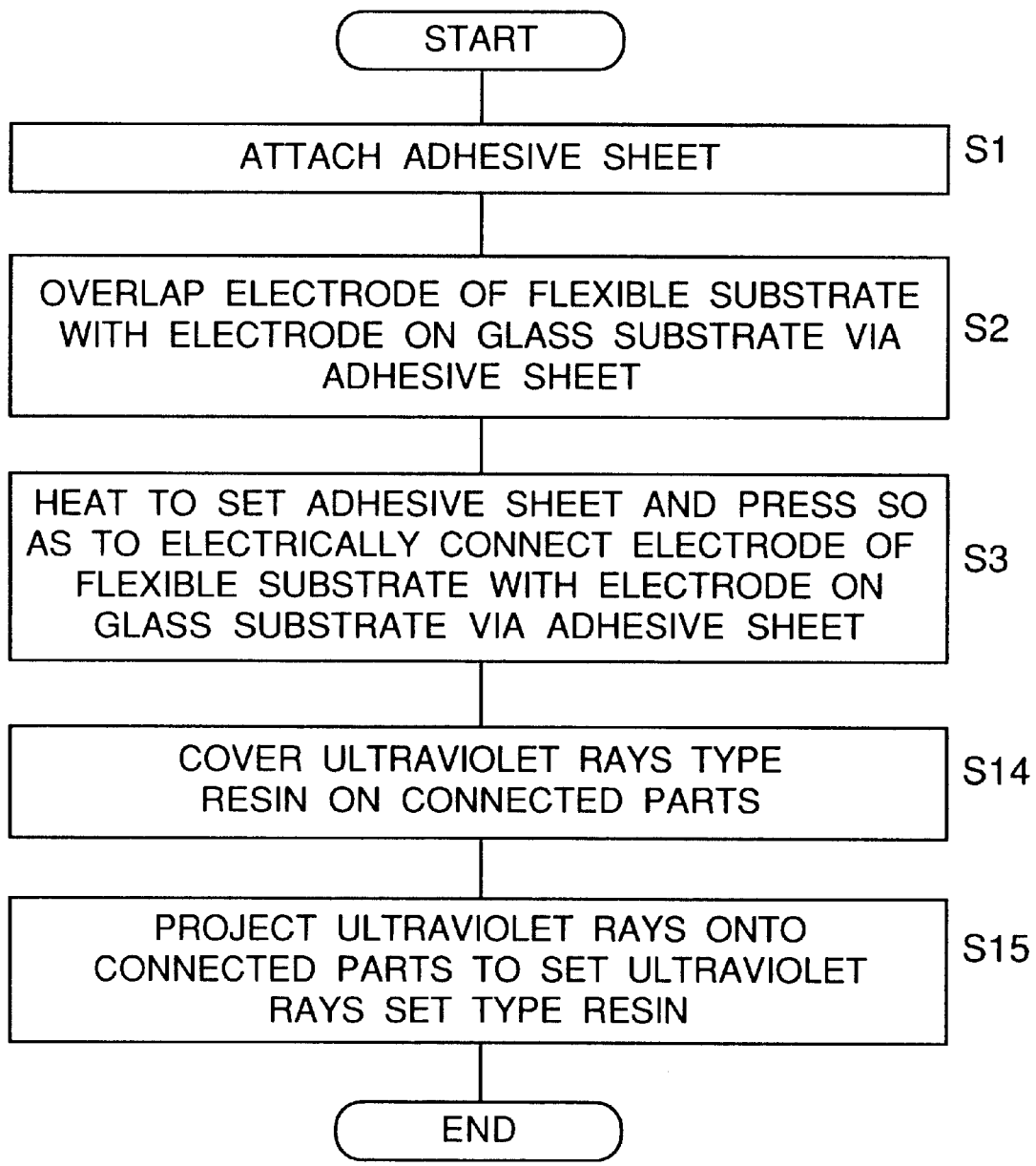
FIG. 16 is a flowchart of connecting the flexible substrate with the glass substrate by using the method of connecting electrodes of the plasma display panel in the fourth embodiment of the present invention.

FIG. 4 is a sectional view of the electrodes 2 on the glass substrate 1 and the electrodes 6 of the flexible substrate 5 after being mounted according to a method of connecting electrodes of a plasma display panel in a fourth embodiment of the present invention. FIG. 7 is a plan view of the electrodes 2 and 6 in a state after being connected. FIG. 16 is a flowchart of connecting the flexible substrate with the glass substrate by using the method of connecting electrodes of the plasma display panel in the fourth embodiment of the present invention. The fourth embodiment is different from the first through third embodiments in that a resin 9 of a type which can be set by ultraviolet rays is applied to cover the connected parts of the electrodes 2 on the glass substrate 1 and the electrodes 6 of the flexible substrate 5 in FIG. 3 (step S14 in FIG. 16), and that ultraviolet rays are projected to the resin 9 to set it (step S15 in FIG. 16).

The resin 9 which can be set by ultraviolet rays can be any kind, but preferably is an epoxy acrylate resin with a high curing strength and good moisture resistance. The conductive particles 4 dispersed in the adhesive sheet 3 are nickel particles or gold-plated nickel particles.

The same characteristics as in the first embodiment apply as to the material and the shape of the adhesive sheet 3, the size of each of the conductive particles 4, the materials and formation methods of the glass substrate 1, the electrodes 2 on the glass substrate 1, the flexible substrate 5 and the electrodes 6 of the flexible substrate 5.

Besides the operation and effect achieved by the first embodiment of the present invention, in the fourth embodiment, the coating of the resin 9 which can be set by ultraviolet rays is effective in preventing the invasion of moisture or corrosive gas to the connected parts of the electrodes 2 and 6 in a short time. The coating can prevent the oxidation of the electrodes 2, and 6, and the conductive particles 4 and avoiding barriers in the electric connection, thereby achieving highly reliable connecting quality.

<Fifth Embodiment>

Figure 5:
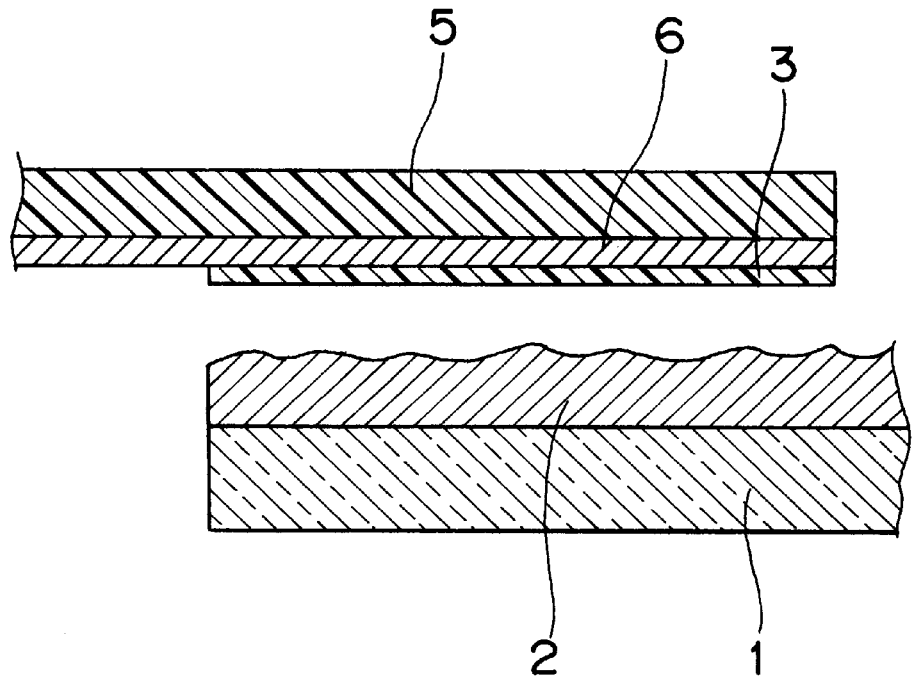
FIG. 5 is a sectional view showing a connect state in a connecting process of a flexible substrate to a glass substrate according to a method of connecting electrodes of a plasma display panel in a fifth embodiment of the present invention.
Figure 6:
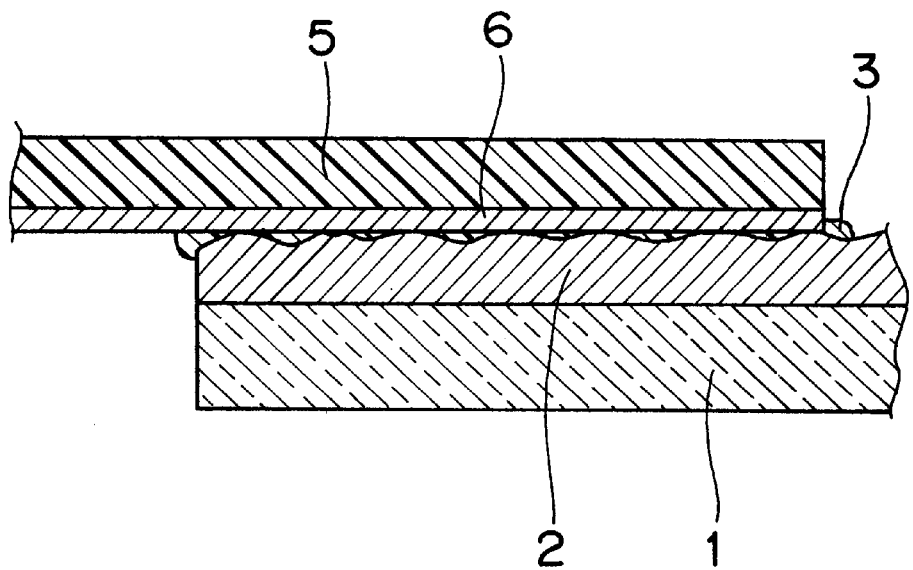
FIG. 6 is a sectional view showing a state after the connecting in the method of FIG. 5.
Figure 17:
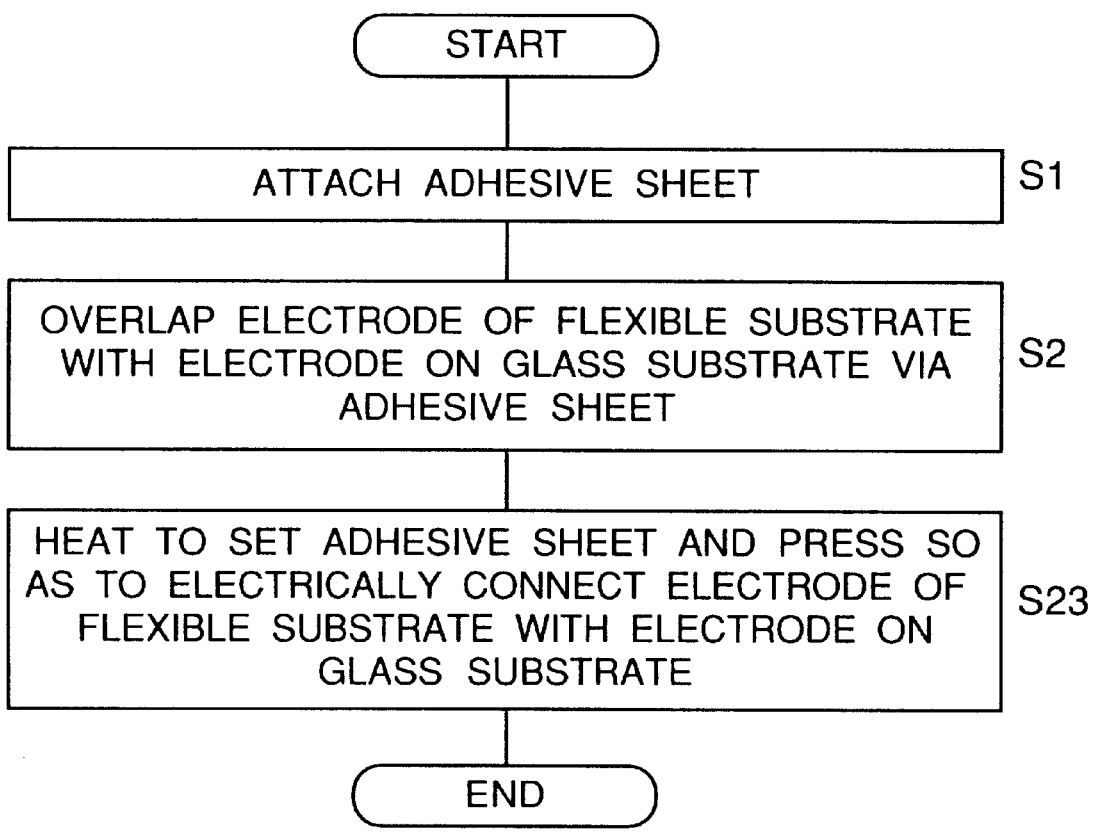
FIG. 17 is a flowchart of connecting the flexible substrate with the glass substrate by using the method of connecting electrodes of the plasma display panel in the fifth embodiment of the present invention.

FIGS. 5 and 6 show a method for connecting electrodes of a plasma display panel according to a fifth embodiment of the present invention. FIG. 7 is a plan view of a state of the electrodes 2 and 6 when connected. FIG. 17 is a flowchart of connecting the flexible substrate with the glass substrate by using the method of connecting electrodes of the plasma display panel in the fifth embodiment of the present invention. The electrodes 2 and 6 are connected via the adhesive sheet 3 not including the conductive particles 4, which is a difference from the first-fourth embodiments (referring to step S23 in FIG. 17).

More specifically, according to the fifth embodiment, the electrodes 6 of the flexible substrate 5 are pressed and heated to the thick film electrodes 2 of the glass substrate 1 via the adhesive sheet 3 not including the conductive particles. At this time, the pits and projections inherently formed on the surface of each of the thick film electrodes 2 with a surface roughness of about 2 μm to 3 μm bite into the electrodes (formed of copper) 6 of the flexible substrate 5, whereby the electrodes 2 and 6 are electrically connected with each other. Before the electrodes 2 and 6 are finally electrically connected with each other by pressure, the adhesive sheet 3 works to temporarily position the electrodes 2, and 6, and does not contain conductive particles and also prevents the silicone resin from invading between the electrodes 2 and 6. Preferably, the pressuring force is 40 kg/cm$^2$ to 50 kg/cm$^2$ and the heating temperature is 180° C. or higher when the electrodes 6 are pressed and heated to the electrodes 2. The pits and projections on the surface of each thick film electrode 2 are approximately ±2 μm high, by way of example. Each connect breadth of the electrodes 2 and 6 is usually not smaller than about 3 mm.

The adhesive sheet 3 can be an anisotropic conductive film (ACF), but is not limited to the ACF. For instance, an epoxy resin which is inexpensive as compared to the ACF may be used as the adhesive sheet for the purpose of temporary fixing.

In the fifth embodiment, as above, the electrodes 2 and 6 are electrically connected by utilizing the fact that the pits and projections generated on the surface of each of the thick film electrodes 2 bite into the surface of each of the confronting electrodes 6. Therefore, the conductive particles are eliminated, which eliminates the need, for example, for uniformly arranging the conductive particles in the adhesive sheet 3. Moreover, according to the method of the fifth embodiment, good connections are secured between the electrodes 2 and 6 without using solders. Such disadvantages inherent in soldering such as connection failures due to the oxidation or corrosion of the solder, poor wettability of the solder, solder bridges, etc., that deteriorate connecting quality can be avoided. Moreover, a high current is allowed, and a narrow pitch of electrodes, e.g., 0.3 mm or smaller becomes possible. As a result, a connecting quality of high reliability is achieved.

Figure 12:
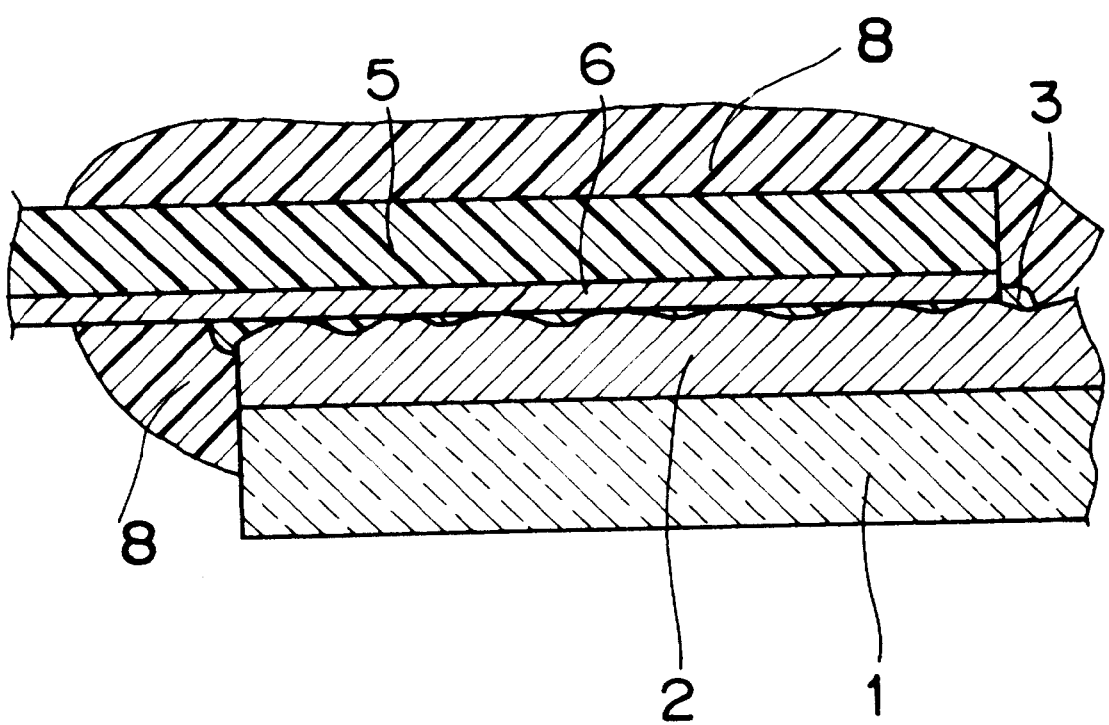
FIG. 12 is a sectional view showing a state where silicone resin is applied to the connected parts after connected by the method of FIG. 5, according to a modification of the method of connecting electrodes of the plasma display panel in the fifth embodiment of the present invention.

In the fifth embodiment as well, if the third or fourth embodiment is adopted, the invasion of moisture or corrosive gas to the connected parts between the electrodes 2 and 6 can be prevented by the silicone resin 8 or the resin 9 which can be set by ultraviolet rays, the oxidation of the electrodes 2, and 6, and the conductive particles 4 is prevented, and barriers to the electric connection are controlled. For example, FIG. 12 is a sectional view showing a state where silicone resin is applied to the connected parts after being connected by the method of FIG. 5, according to a modification of the method of connecting electrodes of the plasma display panel in the fifth embodiment of the present invention.

In the above first through fourth embodiments, although a material of each of the conductive particles 4 is not specified, the conductive particles 4 are preferably nickel particles, gold-plated nickel particles or gold particles in order to prevent the oxidation of silver in the event that each of the thick film electrodes 2 is formed from silver.

The present invention is applicable to both DC type and AC type plasma display panels. Working examples of the present invention will be depicted below.

WORKING EXAMPLE 1

Working example 1 will be discussed with reference to FIG. 1. An adhesive sheet 3 (thermosetting epoxy resin, 3 mm wide, 40 μm thick) having nickel particles (5 μm particle size) dispersed as conductive particles 4 is attached to silver electrodes 2 of each of a thick film (10 μm thick, 0.3 mm pitch) formed on a glass 1 (3 mm thick) by screen printing and baking. At this time, a heating temperature is 100° C., a pressuring force is 10 kg/cm$^2$, and a pressuring time is five seconds. Thereafter, electrodes 6 of a flexible substrate 5 are attached to the electrodes 2 of the glass substrate 1. The flexible substrate 5 is heated and pressured from thereabove by a pressuring tool 7, thereby setting to the adhesive sheet 3 and electrically connecting the thick film silver electrodes 2 and the electrodes 6 of the flexible substrate 5 onto the glass substrate 1. A heating temperature at this time is 170° C., a pressuring force is 20 kg/cm$^2$ and a pressuring time is 20 seconds.

Although the material, size, and thickness of each of the glass substrate, electrode on the glass substrate, flexible substrate, electrode of the flexible substrate, adhesive sheet and conductive particles, etc., and the pressure, temperature and time in each process are as specified above in the description, the specification is one example and not limited to the above.

WORKING EXAMPLE 2

Conductive particles 4 dispersed in the adhesive sheet 3 in the working example 1 are replaced with gold-plated nickel particles (5 μm particle size). The gold plating is performed by flash plating.

The other procedures and conditions are the same as in the working example 1.

WORKING EXAMPLE 3

A silicone resin 8 (de-alcohol type silicone resin, SE4486 by Toray Dow Corning Silicone Inc.) is applied and set (left at 25° C. for three hours) to cover connected parts of what is obtained by connecting and electrically connecting the electrodes 2 on the glass substrate 1 and the electrodes 6 of the flexible substrate 5 in the working example 1.

The other procedures and conditions are kept the same as in the working example 1.

WORKING EXAMPLE 4

A resin 8 which can be set by ultraviolet rays (epoxy acrylate resin, PSR-310 by Go-oh Chemical Co., Ltd.) is applied and set (by irradiating 365 nm ultraviolet rays with 1000 mJ/cm for 10 seconds) to cover connected parts of what is obtained by connecting and electrically connecting the electrodes 2 on the glass substrate 1 and the electrodes 6 of the flexible substrate 5 in the working example 1.

The other processes and conditions are the same as in the working example 1.

COMPARATIVE EXAMPLE

Electrodes 6 of a solder-plated flexible substrate 5 (15 μm thick solder) are registered to silver electrodes 2 of each thick film (10 μm thick, 0.3 mm pitch) formed on a glass 1 (3 mm thick) by screen printing and baking. Then, the flexible substrate 5 is heated and pressed from above by a pressuring tool 7, thereby to melt solder 10 and electrically connect the thick film silver electrodes 2 and electrodes 6 of the flexible substrate 5 onto the glass substrate 1 (at 230° C. with 2 kg/cm$^2$ for three seconds).

Fifty samples of the working examples 1–4 and comparative example are prepared. An electric connection failure rate is determined after the samples are subjected to various reliability tests and a breakage rate of substrates at the exchange time of IC components are checked.

TABLE 1

| Item | Electric connection failure rate (%) at initial stage | Electric connection failure rate (%) after 500 heat cycles | Break rate (%) of substrate 2000 h later at 85° C. 85% RH |
|---|---|---|---|
| Working Example 1 | 0 | 0 | 0 |
| Working Example 2 | 0 | 0 | 0 |
| Working Example 3 | 0 | 0 | 0 |
| Working Example 4 | 0 | 0 | 0 |
| Comparative Example | 12 | 26 | 52 |

Condition for Heat Cycle Test:

−40° C.~125° C. for 30 minutes each. As a result of the test, it was found that the working examples 1–4 have an electric connection failure rate of 0% after 500 heat cycles and a break rate of 0% of substrate 2000 h later at 85° C. 85% RH, as compared with the comparative example.

According to the present invention, the method realized ensures good electric connections between the electrodes on the glass substrate and electrodes of the flexible substrate, and meets the requirements of a high current and a narrow pitch of the electrodes, thereby achieving highly reliable connecting quality.

Although the present invention is directed to the plasma display panels, the present invention can be applied to display devices in which high currents are applied between terminals thereof so as to display information or data and so on.

The entire disclosure of Japanese Patent Application No. 9-112377 filed on Apr. 30, 1997, including specification, claims, drawings, and summary is incorporated herein by reference in its entirety.

Although the present invention has been fully described in connection with the preferred embodiments thereof and with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for connecting electrodes of a plasma display panel, comprising:

overlapping a thick film electrode formed on a glass substrate with an electrode of a flexible substrate via a temporary fixing adhesive sheet which comprises only one layer so that the temporary fixing adhesive sheet temporarily positions the thick film electrode of the glass substrate and the electrode of the flexible substrate, wherein the temporary fixing adhesive sheet does not contain any conductive particles;

heating and pressuring the flexible substrate from above with a pressuring tool, thereby setting the temporary fixing adhesive sheet while letting pits and projections on a surface of the thick film electrode of the glass substrate bite into the electrode of the flexible substrate, and thereby electrically connecting the electrode to the thick film electrode with each other as a connected part;

covering the connected part where the electrode of the flexible substrate and the thick film electrode of the glass substrate are connected with a silicone resin, wherein the temporary fixing adhesive sheet prevents the silicone resin from invading between the thick film electrode of the glass substrate and the electrode of the flexible substrate; and setting the silicone resin.

2. A method for connecting electrodes of a plasma display panel, comprising:

overlapping a thick film electrode formed on a glass substrate with an electrode of a flexible substrate via an adhesive sheet having conductive particles dispersed therein, wherein the flexible substrate comprises a first surface on which is located the electrode and a second surface opposite to the first surface;

heating and pressuring the flexible substrate from above with a pressuring tool, thereby setting the adhesive sheet, and thereby electrically connecting the thick film electrode of the glass substrate and the electrode of the flexible substrate with each other as a connected part;

covering the connected part where the electrode of the flexible substrate and the thick film electrode of the glass substrate are connected with a silicone resin, and also covering the second surface of the flexible substrate opposite to the electrode surface with the silicone resin; and setting the silicone resin.

3. A method for connecting electrodes of a plasma display panel according to claim 2, wherein said overlapping comprises overlapping a thick film silver electrode formed on the glass substrate with the electrode of the flexible substrate via an adhesive sheet having nickel particles.

4. A method for connecting electrodes of a plasma display panel according to claim 3, wherein said overlapping comprises overlapping the thick film silver electrode formed on the glass substrate with the electrode of the flexible substrate via an adhesive sheet having gold-plated nickel particles.

5. A method for connecting electrodes of a plasma display panel according to claim 2, wherein said covering comprises covering with a silicone resin having a thickness of 0.3 $\mu$m to 2 mm.

6. A method for connecting electrodes of a plasma display panel according to claim 2, wherein said covering comprises covering front and rear surfaces of the connected part with the silicone resin, wherein the silicone resin on the rear surface of the connected part is integrally mixed with the silicone resin on the front surface of the connected part.

7. A method for connecting electrodes of a plasma display panel according to claim 1, wherein said covering comprises covering with a silicone resin of a type which can be set by ultraviolet rays; and projecting ultraviolet rays on the silicone resin for setting the silicone resin.

8. A method for connecting electrodes of a plasma display panel according to claim 2, further comprising:

applying a high voltage of 250V between terminals of the plasma display panel; and wherein said overlapping comprises overlapping the thick film electrode formed on the glass substrate with the electrode of the flexible substrate via an adhesive sheet for temporary fixing, the adhesive sheet with a breadth of 1 mm or larger and a thickness of 15 $\mu$m to 60 $\mu$m, and having conductive particles with a particle size of 3 $\mu$m to 15 $\mu$m dispersed therein.

9. A method for connecting electrodes of a plasma display panel according to claim 8, wherein:

said overlapping further comprises overlapping a thick film electrode with a thickness of 5 $\mu$m to 15 $\mu$m formed on a glass substrate with an electrode of a flexible substrate via an adhesive sheet for temporary fixing with a breadth of 1 mm or larger and a thickness of 35 µm to 40 µm, and having conductive particles having the particle size of 3 µm to 15 µm dispersed therein; and wherein said covering further comprises covering with a silicone resin with a thickness of 0.3 µm to 2 mm.

10. A plasma display panel produced according to the method of claim 1.

11. A plasma display panel produced according to the method of claim 2.

12. A method for connecting electrodes of a plasm display panel according to claim 2, wherein said overlapping comprises overlapping the thick film electrode formed on the glass substrate with the electrode of the flexible substrate via an adhesive sheet which comprises only one layer having conductive particles dispersed therein.

13. A method for connecting electrodes of a plasma display panel comprising:

overlapping a thick film electrode formed on a glass substrate with an electrode of a flexible substrate via an adhesive sheet having conductive particles dispersed therein, wherein the flexible substrate comprises a first surface on which is located the electrode and a second surface opposite to the first surface;

heating and pressuring the flexible substrate from above with a pressuring tool, thereby setting the adhesive sheet, and thereby electrically connecting the thick film electrode of the glass substrate and the electrode of the flexible substrate with each other as a connected part;

covering the connected part where the electrode of the flexible substrate and the thick film electrode of the glass substrate are connected with a resin of a type which can be set by ultraviolet rays; and projecting ultraviolet rays on the resin, thereby setting the resin.

14. A method for connecting electrodes of a plasma display panel according to claim 13, wherein said overlapping comprises overlapping a thick film silver electrode formed on the glass substrate with the electrode of the flexible substrate via an adhesive sheet having conductive particles comprising nickel particles dispersed therein.

15. A method for connecting electrodes of a plasma display panel according to claim 14, wherein said overlapping comprises overlapping a thick film electrode comprising silver formed on a glass substrate with an electrode of a flexible substrate via an adhesive sheet having conductive particles comprising gold-plated nickel particles dispersed therein.

16. A plasma display panel produced according to the method of claim 13.

17. A method for connecting electrodes of a plasm display panel according to claim 13, wherein said covering comprises covering the connected part where the electrode of the flexible substrate and the thick film electrode of the glass substrate are connected with the resin of the type which can be set by ultraviolet rays, and also covering the second surface of the flexible substrate with the resin of the type which can be set by ultraviolet rays.

* * * * *

UNITED STATES PATENT AND TRADEMARK OFFICE
CERTIFICATE OF CORRECTION

PATENT NO. : 6,086,441 C1  
APPLICATION NO. : 09/069334  
DATED : October 21, 2008  
INVENTOR(S) : Akiguchi et al.

Page 1 of 1

It is certified that error appears in the above-identified patent and that said Letters Patent is hereby corrected as shown below:

In column 1, line 16 should read --The patentability of claims 1, 7 and 10 is confirmed.--

In column 1, lines 20 and 21 should read --Claims 2, 6, 8, 9, 12 and 13 are determined to be patentable as amended.--

In column 2, between lines 21 and 22, insert the following claim:

--12. A method for connecting electrodes of a *plasma* [plasm] display panel according to claim *6* [2,] wherein said *covering comprises covering the front and rear surfaces of the connected part with the silicone resin and integrally mixing the silicone resin on the rear surface of the connected part with the silicone resin on the front surface of the connected part without forming any boundary at a circumference of the connected part* [overlapping comprises overlapping the thick film electrode formed on the glass substrate with the electrode of the flexible substrate via an adhesive sheet which comprises only one layer having conductive particles dispersed therein].--

Signed and Sealed this

Sixth Day of January, 2009

JON W. DUDAS  
*Director of the United States Patent and Trademark Office*

UNITED STATES PATENT AND TRADEMARK OFFICE
CERTIFICATE OF CORRECTION

PATENT NO. : 6,086,441 C1  
APPLICATION NO. : 90/007393  
DATED : October 21, 2008  
INVENTOR(S) : Akiguchi et al.

Page 1 of 1

It is certified that error appears in the above-identified patent and that said Letters Patent is hereby corrected as shown below:

In column 1, line 16 should read --The patentability of claims 1, 7 and 10 is confirmed.--

In column 1, lines 20 and 21 should read --Claims 2, 6, 8, 9, 12 and 13 are determined to be patentable as amended.--

In column 2, between lines 21 and 22, insert the following claims:

--12. A method for connecting electrodes of a *plasma* [plasm] display panel according to claim *6* [2,] wherein said *covering comprises covering the front and rear surfaces of the connected part with the silicon resin and integrally mixing the silicone resin on the rear surface of the connected part with the silicone resin on the front surface of the connected part without forming any boundary at a circumference of the connected part* [overlapping comprises overlapping the thick film electrode formed on the glass substrate with the electrode of the flexible substrate via an adhesive sheet which comprises only one layer having conductive particles dispersed therein].--

This certificate supersedes the Certificate of Correction issued January 6, 2009.

Signed and Sealed this

Ninth Day of June, 2009

JOHN DOLL  
*Acting Director of the United States Patent and Trademark Office*

(12) EX PARTE REEXAMINATION CERTIFICATE (6484th)
United States Patent
Akiguchi et al.

(10) Number: US 6,086,441 C1
(45) Certificate Issued: Oct. 21, 2008

(54) METHOD FOR CONNECTING ELECTRODES OF PLASMA DISPLAY PANEL

(75) Inventors: Takashi Akiguchi, Osaka (JP); Kazuto Nishida, Katano (JP)

(73) Assignee: Matsushita Electric Industrial Co., Ltd., Kadoma-shi, Osaka-fu (JP)

Reexamination Request:
No. 90/007,393, Jan. 26, 2005

Reexamination Certificate for:
Patent No.: 6,086,441
Issued: Jul. 11, 2000
Appl. No.: 09/069,334
Filed: Apr. 29, 1998

(30) Foreign Application Priority Data

Apr. 30, 1997 (JP) ............................................. 9-112377

(51) Int. Cl.
*H01J 9/24* (2006.01)
*H01J 9/28* (2006.01)
*H05K 3/36* (2006.01)
*H05K 3/28* (2006.01)
*H05K 3/30* (2006.01)
*H05K 1/09* (2006.01)
*H05K 3/32* (2006.01)

(52) U.S. Cl. .......................................... 445/24; 349/152
(58) Field of Classification Search ........................ None
See application file for complete search history.

(56) References Cited

U.S. PATENT DOCUMENTS

| 4,384,287 A | * | 5/1983 | Sakuma ........................ 345/60 |
| 5,592,199 A | * | 1/1997 | Kawaguchi et al. ......... 345/206 |

FOREIGN PATENT DOCUMENTS

| JP | 56-38964 | 4/1981 |
|---|---|---|
| JP | 56-55874 | 5/1981 |
| JP | 61-70376 | 5/1986 |
| JP | 63-70585 | 5/1988 |
| JP | 63-165683 | 10/1988 |
| JP | 64-43390 | 3/1989 |
| JP | 1-140747 | 9/1989 |
| JP | 02-022694 | 1/1990 |
| JP | 3-96921 | 4/1991 |
| JP | 3-184077 | 8/1991 |
| JP | 3-112732 | 11/1991 |
| JP | 4-8465 | 1/1992 |
| JP | 04-022045 | 1/1992 |
| JP | 4-28625 | 3/1992 |
| JP | 04-142049 | 5/1992 |
| JP | 04-066041 | * 6/1992 |
| JP | 4-181223 | 6/1992 |
| JP | 4-183767 | 6/1992 |
| JP | 4-254826 | 9/1992 |
| JP | 04-332429 | 11/1992 |
| JP | 5-27251 | 2/1993 |
| JP | 5-89784 | 4/1993 |
| JP | 05-190612 | 7/1993 |
| JP | 5-217501 | 8/1993 |
| JP | 05-226409 | 9/1993 |
| JP | 05-265023 | 10/1993 |
| JP | 5-281566 | 10/1993 |
| JP | 06-021152 | 1/1994 |
| JP | 06-099499 | 4/1994 |

(Continued)

OTHER PUBLICATIONS

Yamada Yukio et al., "Anisotropic Conductive Film," Parts and Materials for Liquid Crystal Display, Jun. 1996.*

(Continued)

*Primary Examiner*—James Menefee

(57) ABSTRACT

A method is disclosed for connecting electrodes of a plasma display panel. The method includes overlapping a thick film electrode formed on a glass substrate with an electrode of a flexible substrate via an adhesive sheet having concductive particles dispersed therein, then, heating and pressuring from above the flexible substrate with a pressuring tool, to thereby set the adhesive sheet, and finally electrically connecting the electrode of the glass substrate and the electrode of the flexible substrate with each other.

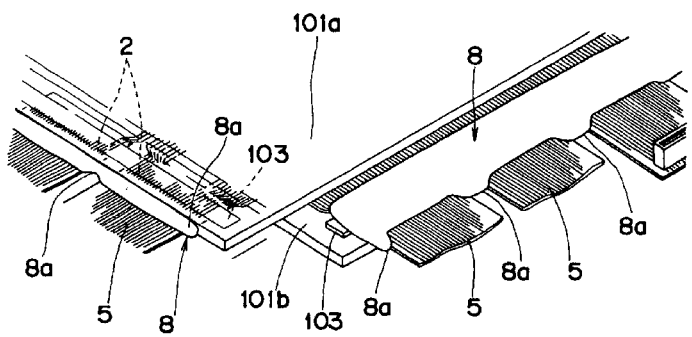
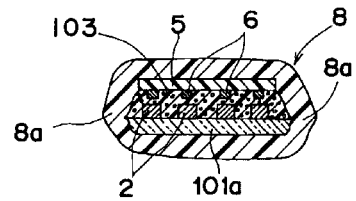

FOREIGN PATENT DOCUMENTS

| | | |
|---|---|---|
| JP | 06-175146 | 6/1994 |
| JP | 6-223896 | 8/1994 |
| JP | 06-318478 | 11/1994 |
| JP | 06-333662 | 12/1994 |
| JP | 7-72493 | 3/1995 |
| JP | 7-191341 | 7/1995 |
| JP | 07-211425 | 8/1995 |
| JP | 07-226569 | 8/1995 |
| JP | 7-244291 | 9/1995 |
| JP | 7-261192 | 10/1995 |
| JP | 7-316519 | 12/1995 |
| JP | 08-064279 | 3/1996 |
| JP | 8-320498 | 12/1996 |
| JP | 9-101533 | 4/1997 |
| JP | 09-197427 | 7/1997 |

OTHER PUBLICATIONS

Motoo Sugawara et al., "Surface–Discharge Color Plasma Display with Common Electrode Structure," SID 88 Digest, 1988.*

Alan Sobel, "Gas–Discharge Displays: The State of the Art," no date.*

Shigeo Mikoshiba, "Latest Technology in Plasma Display," chapter 4, May 1996.*

Karl Lindner et al., "Pulse Heat Bonding, A Method for Interconnections with Anisotropic Conductive Adhesive Foil (ACAF) and Heat Seal Connectors," Paper presented Nov. 1994, Berlin.*

* cited by examiner

US 6,086,441 C1

EX PARTE
REEXAMINATION CERTIFICATE
ISSUED UNDER 35 U.S.C. 307

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1, 7, 10 and 12 is confirmed.

Claims 3, 4, 14, 15 and 17 are cancelled.

Claims 2, 6, 8, 9 and 13 are determined to be patentable as amended.

Claims 5, 11 and 16, dependent on an amended claim, are determined to be patentable.

New claims 18–24 are added and determined to be patentable.

2. A method for connecting electrodes of a plasma display panel, comprising:
 overlapping a thick film electrode formed on a glass substrate with an electrode of a flexible substrate via an adhesive sheet having *a resin and* conductive particles dispersed [therein,] *in the resin,* wherein the flexible substrate comprises a first surface on which *the electrode* is located [the electrode] and a second surface opposite to the first surface;
 heating and pressuring the flexible substrate from above *the flexible substrate* with a pressuring tool, thereby setting the adhesive sheet, and thereby electrically connecting the thick film electrode of the glass substrate and the electrode of the flexible substrate with each other as a connected part;
 covering *with a silicone resin* the connected part where the electrode of the flexible substrate and the thick film electrode of the glass substrate are [connected with a silicone resin] *connected*, and also covering *with the silicone resin* the second surface of the flexible substrate opposite to the [electrode] *first* surface [with the silicone resin], *so that a whole circumference of the connected part is covered with the resin of the adhesive sheet and the silicone resin*; and
 setting the silicone resin.

6. A method for connecting electrodes of a plasma display panel according to claim 2, wherein
 said covering comprises covering front and rear surfaces of the connected part with the silicone resin[, wherein the silicone resin on the rear surface of the connected part is integrally mixed with the silicone resin on the front surface of the connected part] *at ends of the flexible substrate in a direction perpendicular to a direction in which the electrode of the flexible substrate elongates and integrally mixing the silicone resin on the rear surface of the connected part with the silicone resin on the front surface of the connected part.*

8. A method for connecting electrodes of a plasma display panel according to claim 2, [further comprising:
 applying a high voltage of 250V between terminals of the plasma display panel; and]
 wherein said overlapping comprises overlapping the thick film electrode formed on the glass substrate with the electrode of the flexible substrate via [an] *the* adhesive sheet for temporary fixing, the adhesive sheet with a breath of *not smaller than* 1 mm [or] *and not larger than 3 mm* and a thickness of 15 μm to 60 μm [, and having conductive particles with a particle size of 3 μm to 15 μm dispersed therein].

9. A method for connecting electrodes of a plasma display panel according to claim 8, wherein:
 said overlapping further comprises overlapping a thick film electrode with a thickness of 5 μm to 15 μm formed on a glass substrate with an electrode of a flexible susbtrate via an adhesive sheet [for temporary fixing with a breadth of 1 mm or larger and] *having* a thickness of 35 μm to 40 μm[, and having conductive particles having the particle size of 3 μm to 15 μm dispersed therein; and
 wherein said covering further comprises covering with a silicone resin with a thickness of 0.3 μm to 2 mm].

13. A method for connecting electrodes of a plasma display panel comprising:
 overlapping a thick film electrode formed on a glass substrate with an electrode of a flexible substrate via an adhesive sheet having *a resin and* conductive particles dispersed [therein] *in the resin*, wherein the flexible substrate comprises a first surface on which [is located] the electrode *is located* and a second surface opposite to the first surface;
 heating and pressuring the flexible substrate from above *the flexible substrate* with a pressuring tool, thereby setting the adhesive sheet, and thereby electrically connecting the thick film electrode of the glass substrate and the electrode of the flexible substrate with each other as a connected part *while the resin of the adhesive sheet outwardly bulges out from a space between the flexible substrate and the glass substrate*;
 covering the connected part where the electrode of the flexible susbtrate and the thick film electrode of the glass substrate are connected with a resin of a type which can be set by ultraviolet rays, *and covering with the resin of the ultraviolet rays-setting type the second surface of the flexible substrate opposite to the first surface, so that a whole circumference of the connected part is covered with the resin of the adhesive sheet and the resin of the ultraviolet rays-setting type*; and
 projecting ultraviolet rays on the resin, thereby setting the resin.

*18. A method for connecting electrodes of a plasma display panel according to claim 13,*
 *wherein said overlapping comprises overlapping the thick film electrode formed on the glass substrate with the electrode of the flexible substrate via an adhesive sheet having a breadth of not smaller than 1 mm and not larger than 3 mm and a thickness of 15 μm to 60 μm.*

*19. A method for connecting electrodes of a plasma display panel according to claim 18,*
 *wherein said overlapping comprises overlapping a thick film electrode formed on the glass substrate has a thickness of 5 μm to 15 μm with the electrode of the flexible substrate via an adhesive sheet having a thickness of 35 μm to 40 μm.*

*20. A method for connecting electrodes of a plasma display panel according to claim 13,*
 *wherein said covering comprises covering with a resin of an ultraviolet rays-setting type having a thickness of 0.3 μm to 2 mm.*

21. A method for connecting electrodes of a plasma display panel according to claim 13,
wherein said covering comprises covering front and rear surfaces of the connected part with the resin of the ultraviolet rays-setting type, wherein the resin on the rear surface of the connected part is integrally connected with the resin on the front surface of the connected part at an end of the connected part.

22. A method for connecting electrodes of a plasma display panel according to claim 21,
wherein said covering comprises covering the front and rear surfaces of the connected part with the resin and integrally mixing the resin of the ultraviolet rays-setting type on the rear surface of the connected part with the resin of the ultraviolet rays-setting type on the front surface of the connected part without forming any boundary at a circumference of the connected part.

23. A method for connecting electrodes of a plasma display panel according to claim 2,
wherein said covering comprises covering with the silicone resin the connected part and the second surface of the flexible substrate, so that ends of the flexible substrate in a direction perpendicular to a direction in which the electrode of the flexible substrate elongates are covered with the silicone resin.

24. A method for connecting electrodes of a plasma display panel according to claim 13,
wherein said covering comprises covering with the resin of the ultraviolet rays-setting type the connected part and the second surface of the flexible substrate, so that ends of the flexible substrate in a direction perpendicular to a direction in which the electrode of the flexible substrate elongates are covered with the resin of the ultraviolet rays-setting type.

* * * * *